United States Patent
Kim et al.

(10) Patent No.: US 11,004,617 B2
(45) Date of Patent: May 11, 2021

(54) METHOD FOR MANUFACTURING ORGANIC-INORGANIC HYBRID SOLAR CELL

(71) Applicant: LG CHEM, LTD., Seoul (KR)

(72) Inventors: Seiyong Kim, Daejeon (KR); Sang Jun Park, Daejeon (KR); Jong Seok Kim, Daejeon (KR); Jaein Lee, Daejeon (KR); Yongnam Kim, Daejeon (KR); Sang Kwon Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 140 days.

(21) Appl. No.: 16/319,238

(22) PCT Filed: Jul. 28, 2017

(86) PCT No.: PCT/KR2017/008155
§ 371 (c)(1),
(2) Date: Jan. 18, 2019

(87) PCT Pub. No.: WO2018/021869
PCT Pub. Date: Feb. 1, 2018

(65) Prior Publication Data
US 2019/0287733 A1   Sep. 19, 2019

(30) Foreign Application Priority Data
Jul. 29, 2016  (KR) .................... 10-2016-0097517

(51) Int. Cl.
*H01L 51/44*   (2006.01)
*H01G 9/20*    (2006.01)
(Continued)

(52) U.S. Cl.
CPC ........... *H01G 9/2059* (2013.01); *H01L 51/00* (2013.01); *H01L 51/0003* (2013.01);
(Continued)

(58) Field of Classification Search
None
See application file for complete search history.

(56) References Cited

U.S. PATENT DOCUMENTS 10,079,356 B2   9/2018  Etgar
2015/0340632 A1* 11/2015 Etgar .................. H01L 51/0032
136/255
(Continued)

FOREIGN PATENT DOCUMENTS

CN   103762315   4/2014
EP   3136450     3/2017
(Continued)

OTHER PUBLICATIONS

Lee et al., "High-Efficiency Perovskite Solar Cells Based on the Black Polymorph of HC(NH2)2PbI3," Adv. Mater. 26: 4991-4998, Wiley Online Library pp. 1-8 (2014).

*Primary Examiner* — Ali Naraghi
(74) *Attorney, Agent, or Firm* — Dentons US LLP

(57) ABSTRACT

A method for manufacturing an organic-inorganic hybrid solar cell, the method including forming a first electrode, forming a first common layer on the first electrode, forming a first light absorbing layer by applying a first perovskite precursor solution including a first organic halide and a first metal halide on the first common layer, forming a second light absorbing layer by applying a second perovskite precursor solution including a second organic halide on the first light absorbing layer, forming a second common layer on the second light absorbing layer; and forming a second electrode on the second common layer.

16 Claims, 3 Drawing Sheets

(51) Int. Cl.
*H01L 51/00* (2006.01)
*H01L 51/42* (2006.01)

(52) U.S. Cl.
CPC .......... *H01L 51/0077* (2013.01); *H01L 51/42* (2013.01); *H01L 51/4213* (2013.01); *Y02E 10/549* (2013.01)

(56) References Cited

U.S. PATENT DOCUMENTS

| | | | |
|---|---|---|---|
| 2015/0349282 A1 | 12/2015 | Seok et al. | |
| 2016/0005547 A1 | 1/2016 | Seok et al. | |
| 2016/0204369 A1* | 7/2016 | Ferrini | H01G 9/209 136/256 |
| 2016/0254472 A1* | 9/2016 | Wang | C23C 14/5846 136/263 |
| 2016/0285021 A1* | 9/2016 | Yang | H01L 51/0032 |
| 2017/0018371 A1* | 1/2017 | Suzuka | H01L 51/0003 |
| 2018/0248052 A1 | 8/2018 | Seok et al. | |

FOREIGN PATENT DOCUMENTS

| | | |
|---|---|---|
| JP | 2010161270 | 7/2010 |
| JP | 2016502282 | 1/2016 |
| JP | 2016025170 | 2/2016 |
| KR | 10-1144246 | 5/2012 |
| KR | 10-2014-0091489 | 7/2014 |
| KR | 10-1461641 | 12/2014 |
| KR | 10-2015-0124413 | 11/2015 |
| KR | 10-1571528 | 11/2015 |
| KR | 10-2015-0135202 | 12/2015 |
| KR | 10-1574658 | 12/2015 |
| KR | 10-2016-0004389 | 1/2016 |
| KR | 10-1626929 | 6/2016 |
| KR | 10-2016-0085720 | 7/2016 |
| WO | 2014180780 | 11/2014 |

* cited by examiner

[Figure 1]
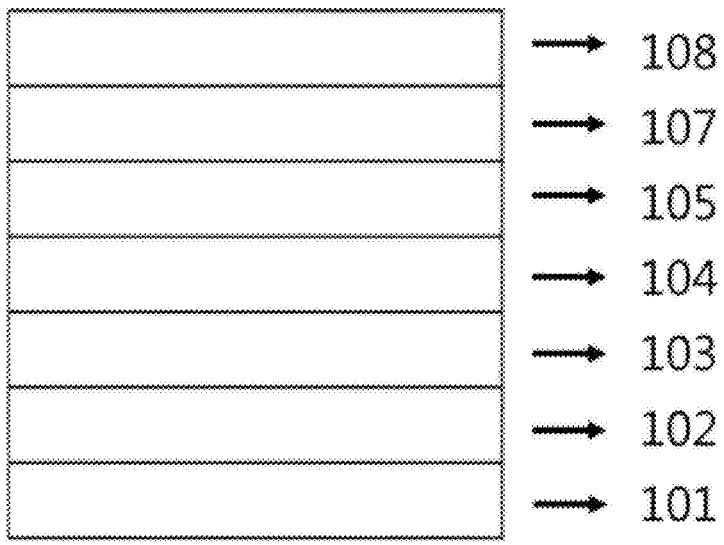
[Figure 2]
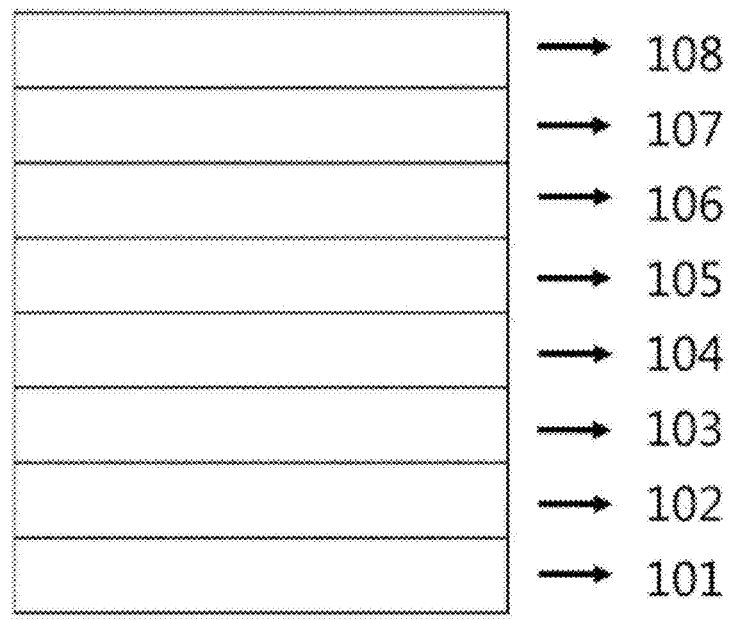

[Figure 3]
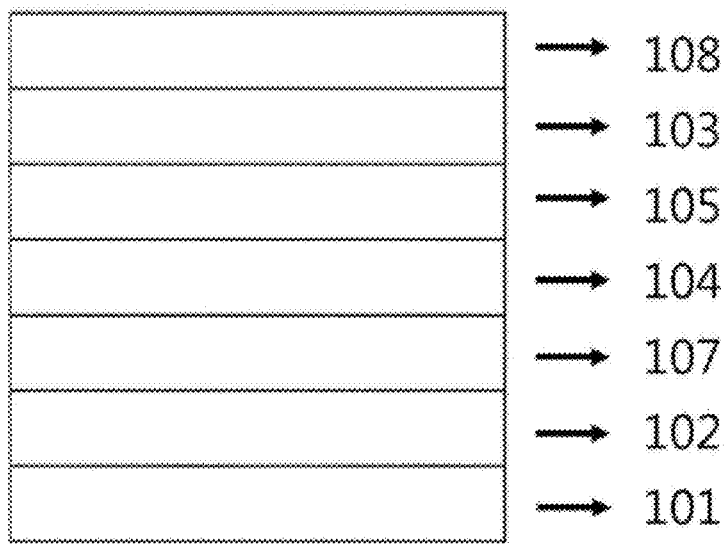
[Figure 4]
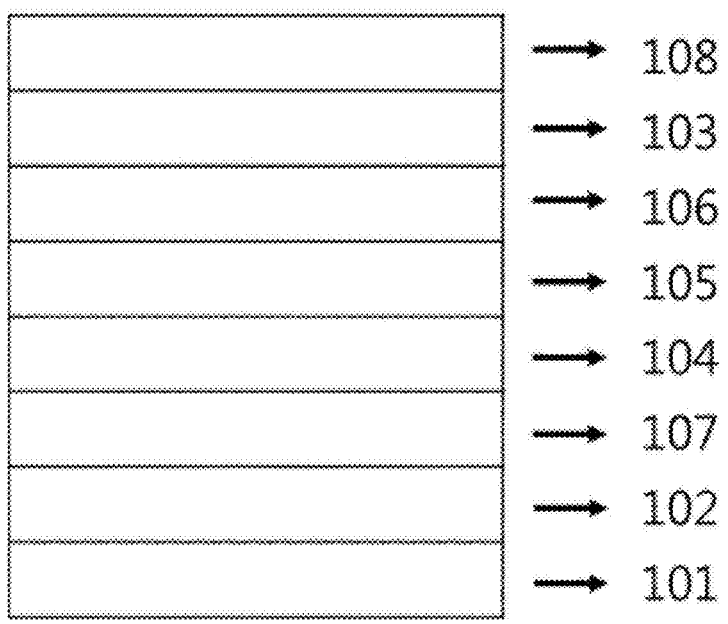

[Figure 5]
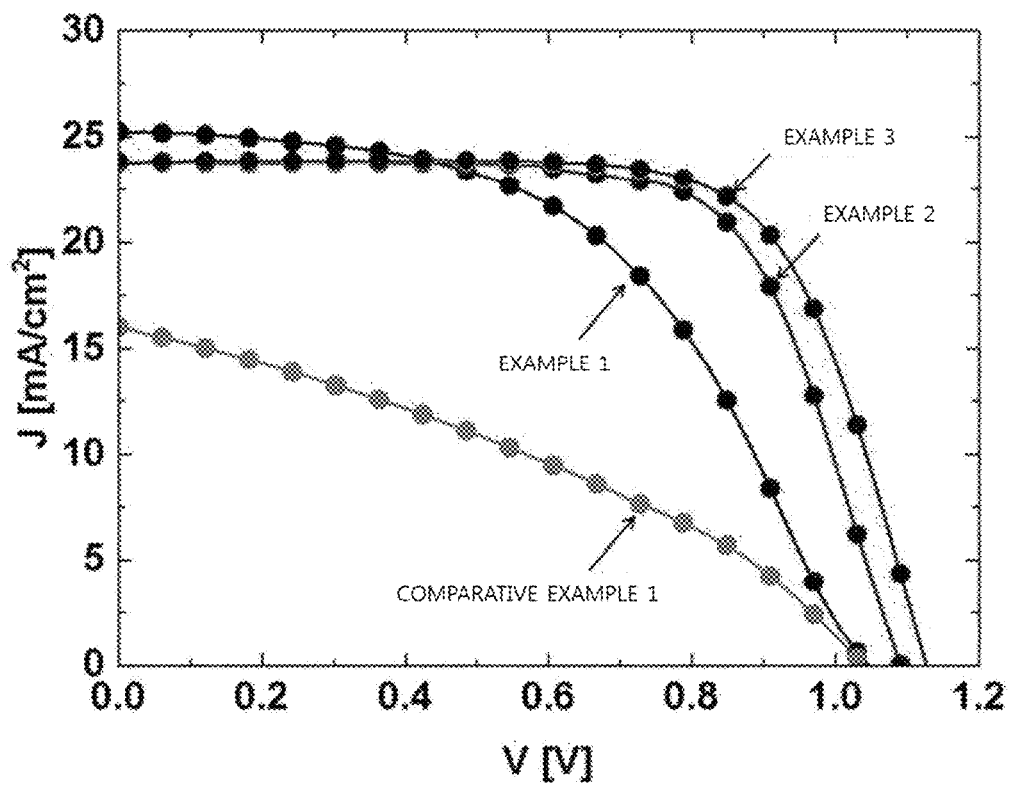
[Figure 6]
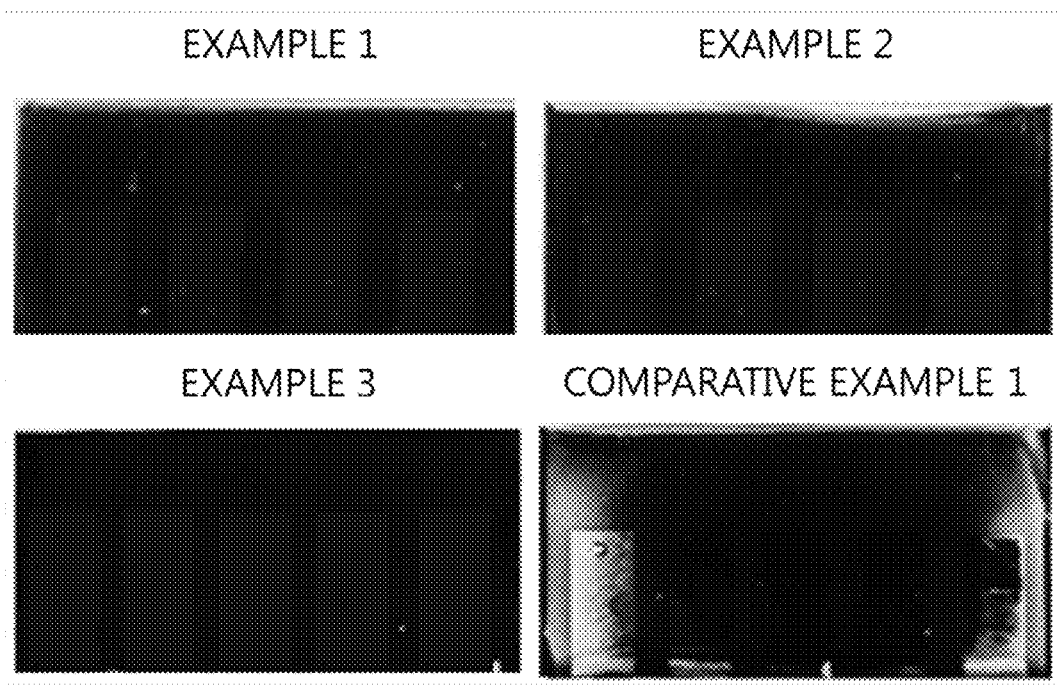

METHOD FOR MANUFACTURING ORGANIC-INORGANIC HYBRID SOLAR CELL

This application is a National Stage Application of International Application No. PCT/KR2017/008155 filed on Jul. 28, 2017, which claims priority to and the benefit of 10-2016-0097517 filed in the Korean Intellectual Property Office on Jul. 29, 2016, the entire contents of which are incorporated herein by reference in their entirety for all purposes as if fully set forth herein.

TECHNICAL FIELD

The present specification relates to a method for manufacturing an organic-inorganic hybrid solar cell.

BACKGROUND ART

In order to solve the global environmental problems caused by the depletion of fossil fuels and the use thereof, studies have been actively conducted on alternative energy sources, which may be regenerated and are clean, such as solar energy, wind power, and water power. Among them, interests in solar cells which change electric energy directly from the sunlight have been greatly increased. Here, the solar cell means a cell which produces current-voltage by using a photovoltaic effect of absorbing photoenergy from the sunlight to generate electrons and holes.

Organic-inorganic hybrid perovskite materials have recently drawn attention as a light absorbing material for organic-inorganic hybrid solar cells due to the characteristics in which the absorption coefficient is high and the material can be easily synthesized through a solution process.

In general, an absorbing layer used in an organic-inorganic hybrid solar cell is composed of a single cation, a metal ion, and a halogen ion as a basic structure which uses an $AMX_3$ component, but in this case, there are problems with low efficiency and stability due to moisture, UV rays, and the like.

Further, among perovskites to which the aforementioned single cation is applied, when $HC(NH_2)_2^+$ and $Cs^+$ are used, a phase transition temperature has room temperature to 50° C. or less, so that a phase transition occurs during the driving or during the storage at room temperature, and as a result, there is a problem in that the crystal type changes. It is known that lattice spacing caused by the phase transition is mainly responsible for deterioration in stability.

DETAILED DESCRIPTION OF THE INVENTION

Technical Problem

The present specification provides a method for manufacturing an organic-inorganic hybrid solar cell which is manufacture by a simple process and has excellent stability and energy conversion efficiency.

Technical Solution

An exemplary embodiment of the present specification provides a method for manufacturing an organic-inorganic hybrid solar cell, the method including: forming a first electrode;

forming a first common layer on the first electrode;

forming a first light absorbing layer by applying a first perovskite precursor solution including a first organic halide and a first metal halide onto the first common layer;

forming a second light absorbing layer by applying a second perovskite precursor solution including a second organic halide onto the first light absorbing layer;

forming a second common layer on the second light absorbing layer; and forming a second electrode on the second common layer.

Advantageous Effects

A method for manufacturing an organic-inorganic hybrid solar cell according to an exemplary embodiment of the present specification has a simple manufacturing process, and has an effect in that a light absorbing layer may be formed even by using an organic halide at a low concentration.

The method for manufacturing an organic-inorganic hybrid solar cell according to an exemplary embodiment of the present specification has an advantage in that it is possible to manufacture an organic-inorganic hybrid solar cell in which a crystal structure of a base layer serves as a binder of crystals of an upper layer to suppress a lattice spacing phenomenon caused by a change in temperature, and as a result, the stability of a device is enhanced.

Further, the method for manufacturing an organic-inorganic hybrid solar cell according to an exemplary embodiment of the present specification has an advantage in that it is possible to manufacture an organic-inorganic hybrid solar cell in which interfacial characteristics of a light absorbing layer are improved, and as a result, current density and energy conversion efficiency are improved.

In addition, the method for manufacturing an organic-inorganic hybrid solar cell according to an exemplary embodiment of the present specification has an advantage in that it is possible to manufacture an organic-inorganic hybrid solar cell in which a broad light spectrum is absorbed, and as a result, a light energy loss is reduced, and energy conversion efficiency is improved. Furthermore, an additional coating process is needed in order to form a base layer, but there is an effect in that the process may be simplified by omitting the additional coating process.

BRIEF DESCRIPTION OF DRAWINGS

FIGS. 1 to 4 exemplify a structure of each of the organic-inorganic hybrid solar cells according to exemplary embodiments of the present specification.

FIG. 5 illustrates a current density according to a voltage in each of the organic-inorganic hybrid solar cells manufactured in exemplary embodiments of the present specification.

FIG. 6 illustrates a state of each of the organic-inorganic hybrid solar cells manufactured in exemplary embodiments of the present specification after 48 hours.

101: Substrate
102: First electrode
103: Electron transporting layer
104: First light absorbing layer
105: Second light absorbing layer
106: Third light absorbing layer
107: Hole transporting layer
108: Second electrode

BEST MODE

Hereinafter, the present specification will be described in detail.

When one part "includes" one constituent element in the present specification, unless otherwise specifically described, this does not mean that another constituent element is excluded, but means that another constituent element may be further included.

When one member is disposed "on" another member in the present specification, this includes not only a case where the one member is brought into contact with another member, but also a case where still another member is present between the two members.

A method for manufacturing an organic-inorganic hybrid solar cell according to an exemplary embodiment of the present specification includes: forming a first electrode;

forming a first common layer on the first electrode;

forming a first light absorbing layer by applying a first perovskite precursor solution including a first organic halide and a first metal halide onto the first common layer;

forming a second light absorbing layer by applying a second perovskite precursor solution including a second organic halide onto the first light absorbing layer;

forming a second common layer on the second light absorption layer; and forming a second electrode on the second common layer.

An exemplary embodiment of the present specification may further include forming a third light absorbing layer by applying a third perovskite precursor solution including a third organic halide onto the second light absorbing layer, between the forming of the second light absorbing layer and the forming of the second common layer.

In the present specification, a precursor means a material in a step before the material becomes a specific material in any metabolism or reaction. For example, a perovskite precursor means a material in a step before the material becomes a perovskite material, and a perovskite precursor solution means a solution including a perovskite precursor.

In the present specification, a first common layer and a second common layer each mean an electron transporting layer or a hole transporting layer. At this time, the first common layer and the second common layer are not the same layer, and for example, when the first common layer is an electron transporting layer, the second common layer is a hole transporting layer, and when the first common layer is a hole transporting layer, the second common layer is an electron transporting layer.

In an exemplary embodiment of the present specification, the first organic halide may be a compound represented by the following Chemical Formula 1.

AX  [Chemical Formula 1]

In Chemical Formula 1,

A is a monovalent cation selected from $C_nH_{2+1}NH_3^+$, $HC(NH_2)_2^+$, $NH_4^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, X is a halogen ion, and n is an integer from 1 to 9.

In an exemplary embodiment of the present specification, the first metal halide may be a compound represented by the following Chemical Formula 2.

$MX_2$  [Chemical Formula 2]

In Chemical Formula 2,

M is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and X is a halogen ion.

In an exemplary embodiment of the present specification, a concentration of the first organic halide in the first perovskite precursor solution may be 0.01 M to 0.15 M.

In an exemplary embodiment of the present specification, a concentration of the first metal halide in the first perovskite precursor solution may be 0.5 M to 1.5 M.

In an exemplary embodiment of the present specification, the first light absorbing layer may include a compound having a perovskite structure represented by the following Chemical Formula 3.

$AMX_3$  [Chemical Formula 3]

In Chemical Formula 3,

A is a monovalent cation selected from $C_nH_{2+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X is a halogen ion, and n is an integer from 1 to 9.

In an exemplary embodiment of the present specification, the second organic halide may be a compound represented by the following Chemical Formula 4 or 5.

RX'  [Chemical Formula 4]

$R'_yR''_{(1-y)}X'_zX''_{(1-z)}$  [Chemical Formula 5]

In Chemical Formula 4 or 5,

R' and R" are different from each other, and R, R', and R" are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, X' and X' are a halogen ion, n is an integer from 1 to 9, $0<y<1$, and $0<z<1$.

In an exemplary embodiment of the present specification, a concentration of the second organic halide in the second perovskite precursor solution may be 0.1 M to 2 M.

In an exemplary embodiment of the present specification, the second light absorbing layer includes a compound having a perovskite structure represented by the following Chemical Formula 6 or 7.

RM'X'  [Chemical Formula 6]

$R'_yR''_{(1-y)}M'X'_zX''_{(3-z)}$  [Chemical Formula 7]

In Chemical Formula 6 or 7,

R' and R" are different from each other, and R, R', and R" are each a monovalent cation selected from $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M' is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X' and X" are each a halogen ion, n is an integer from 1 to 9, $0<y<1$, and $0<z<3$.

In an exemplary embodiment of the present specification, the third organic halide includes a compound represented by the following Chemical Formula 8.

$$EX'''\quad\quad\quad\text{[Chemical Formula 8]}$$

In Chemical Formula 8,

E is a monovalent cation selected from $C_nH_{2n+1}NH_3^+$, $HC(NH_2)_2^+$, $NH_4^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, X''' is a halogen ion, and n is an integer from 1 to 9.

In an exemplary embodiment of the present specification, a concentration of the third organic halide in the third perovskite precursor solution may be 0.01 M to 0.15 M.

In an exemplary embodiment of the present specification, the third light absorbing layer may include a compound having a perovskite structure represented by the following Chemical Formula 9.

$$EM''X'''_3\quad\quad\quad\text{[Chemical Formula 9]}$$

In Chemical Formula 9,

E is a monovalent cation selected from $C_nH_{2n+1}NH_3^+$, $NH_4^+$, $HC(NH_2)_2^+$, $CS^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M'' is a divalent metal ion selected from $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X''' is a halogen ion, and n is an integer from 1 to 9.

In general, a procedure of forming a first light absorbing layer for forming a light absorbing layer as a three-layer structure needs a two-step procedure composed of a step of coating a first metal halide and a step of coating a first organic halide, and a suitable heat treatment in each step.

However, in the present specification, the method for manufacturing an organic-inorganic hybrid solar cell may omit a separate step of coating a first organic halide and a separate heat treatment procedure because two materials are simultaneously coated by adding a first organic halide to a step of coating a first metal halide in forming a first light absorbing layer, so that the process is simple. That is, a first light absorbing layer may be formed only by a first-step process.

Accordingly, in general, a four-step process of coating a first metal halide (first step), coating a first organic halide (second step), coating a second organic halide (third step), and coating a third organic halide (fourth step) is needed in order to form a light absorbing layer as a three-layer structure, but a procedure of forming a light absorbing layer as a three-layer structure in the present specification is composed only of a simple three-step process including a step of simultaneously coating a first metal halide and a first organic halide (first step), a step of coating a second organic halide (second step), and a step of coating a third organic halide (third step).

Further, since a small amount of the first organic halide is only needed in the first step and a low concentration of the third organic halide is used in the third step, there is an advantage in that it is possible to lower costs of raw materials.

In the present specification, the perovskite precursor solution may include, as a solvent, at least one of dimethylformamide (DMF), isopropyl alcohol (IPA), dimethylsulfoxide (DMSO), γ-butyrolactone (GBL), n-methylpyrrolidone (NMP), propylene glycol methyl ether (PGME), and propylene glycol monomethyl ether acetate (PGMEA).

In the present specification, the perovskite precursor solution may include all of a first perovskite precursor solution, a second perovskite precursor solution, and a third perovskite precursor solution, unless otherwise mentioned.

FIG. 1 exemplifies a structure of an organic-inorganic hybrid solar cell manufactured by a method for manufacturing an organic-inorganic hybrid solar cell according to an exemplary embodiment of the present specification. Specifically, FIG. 1 exemplifies a structure of an organic-inorganic hybrid solar cell, in which a first electrode 102 is provided on a substrate 101, an electron transporting layer 103 is provided on the first electrode 102, a first light absorbing layer 104 is provided on the electron transporting layer 103, a second light absorbing layer 105 is provided on the first light absorbing layer 104, a hole transporting layer 107 is provided on the second light absorbing layer 105, and a second electrode 108 is provided on the hole transporting layer 107.

FIG. 2 exemplifies a structure of an organic-inorganic hybrid solar cell manufactured by a method for manufacturing an organic-inorganic hybrid solar cell according to an exemplary embodiment of the present specification. Specifically, FIG. 2 exemplifies a structure of an organic-inorganic hybrid solar cell, in which a first electrode 102 is provided on a substrate 101, an electron transporting layer 103 is provided on the first electrode 102, a first light absorbing layer 104 is provided on the electron transporting layer 103, a second light absorbing layer 105 is provided on the first light absorbing layer 104, a third light absorbing layer 106 is provided on the second light absorbing layer 105, a hole transporting layer 107 is provided on the third light absorbing layer 106, and a second electrode is provided on the hole transporting layer 107.

FIG. 3 exemplifies a structure of an organic-inorganic hybrid solar cell manufactured by a method for manufacturing an organic-inorganic hybrid solar cell according to an exemplary embodiment of the present specification. Specifically, FIG. 3 exemplifies a structure of an organic-inorganic hybrid solar cell, in which a first electrode 102 is provided on a substrate 101, a hole transporting layer 107 is provided on the first electrode 102, a first light absorbing layer 104 is provided on the hole transporting layer 107, a second light absorbing layer 105 is provided on the first light absorbing layer 104, an electron transporting layer 103 is provided on the second light absorbing layer 105, and a second electrode 108 is provided on the electron transporting layer 103.

FIG. 4 exemplifies a structure of an organic-inorganic hybrid solar cell manufactured by a method for manufacturing an organic-inorganic hybrid solar cell according to an exemplary embodiment of the present specification. Specifically, FIG. 4 exemplifies a structure of an organic-inorganic hybrid solar cell, in which a first electrode 102 is provided on a substrate 101, a hole transporting layer 107 is provided on the first electrode 102, a first light absorbing layer 104 is provided on the hole transporting layer 107, a second light absorbing layer 105 is provided on the first light absorbing layer 104, a third light absorbing layer 106 is provided on the second light absorbing layer 105, an electron transporting layer 103 is provided on the third light absorbing layer 106, and a second electrode 108 is provided on the electron transporting layer 103.

The organic-inorganic hybrid solar cell according to the present specification is not limited to the stacking structures in FIGS. 1 to 4, and may further include an additional member.

In an exemplary embodiment of the present specification, the first light absorbing layer may be manufactured to have a thickness of 1 nm to 100 nm. When the first light absorbing layer is manufactured to have the thickness as described above, there is an effect of allowing the first light absorbing layer to adjust an energy level with the common layer and act as a base layer of the second light absorbing layer.

In the present specification, the thickness of the first light absorbing layer means a width between the surface on which the first light absorbing layer is brought into contact with the first common layer and the surface on which the first light absorbing layer is brought into contact with the second light absorbing layer.

In an exemplary embodiment of the present specification, the second light absorbing layer may be manufactured to have a thickness of 1 nm to 600 nm. When the second light absorbing layer is manufactured to have the thickness as described above, the second light absorbing layer may act as a main light absorbing layer.

In the present specification, the thickness of the second light absorbing layer means a width between the surface on which the second light absorbing layer is brought into contact with the first light absorbing layer and the surface on which the second light absorbing layer is brought into contact with the second common layer.

In an exemplary embodiment of the present specification, the third light absorbing layer may be manufactured to have a thickness of 1 nm to 100 nm. When the third light absorbing layer is manufactured to have the thickness as described above, there are effects of improving interfacial characteristics between the light absorbing layer and the common layer by reducing surface defects of the second light absorbing layer and increasing an open-circuit voltage by decreasing an offset between energy levels of the light absorbing layer and the common layer.

In the present specification, the thickness of the third light absorbing layer means a width between the surface on which the third light absorbing layer is brought into contact with the second light absorbing layer and the surface on which the third light absorbing layer is brought into contact with the second common layer.

In the present specification, a light absorbing layer means at least one or all of a first light absorbing layer, a second light absorbing layer, and a third light absorbing layer.

In the present specification, the light absorbing layer may be formed by a method such as spin coating, slit coating, dip coating, inkjet printing, gravure printing, spray coating, doctor blade, bar coating, brush painting, and thermal deposition.

In the present specification, the first organic halide includes a single cation. In the present specification, the single cation means that one kind of cation is used. That is, A in Chemical Formula 1 means that only one kind of monovalent cation is selected. For example, in Chemical Formula 1, A may be $C_nH_{2n+1}NH_3^+$, and n may be an integer from 1 to 9.

In the present specification, the compound having the perovskite structure in the first light absorbing layer includes a single cation. For example, in Chemical Formula 3, A may be $C_nH_{2n+1}NH_3^+$, and n may be an integer from 1 to 9.

In the present specification, the second organic halide includes a single cation. For example, R in Chemical 4 may be $HC(NH_2)_2^+$.

In the present specification, the compound having the perovskite structure in the second light absorbing layer includes a single cation. For example, R in Chemical 6 in the present specification may be $HC(NH_2)_2^+$.

In the present specification, the second organic halide includes a complex cation. In the present specification, the complex cation means that two or more kinds of cations are used. That is, in Chemical Formula 5, R' and R" each mean that different monovalent cations are selected. For example, in Chemical Formula 5, R' may be $C_nH_{2+1}NH_3^+$, R" may be $HC(NH_2)_2^+$, and n may be an integer from 1 to 9.

In the present specification, the compound having the perovskite structure in the second light absorbing layer includes a complex cation. For example, in Chemical Formula 7, R' may be $C_nH_{2n+1}NH_3^+$, R" may be $HC(NH_2)_2^+$, and n may be an integer from 1 to 9.

In the present specification, the third organic halide includes a single cation. For example, in Chemical Formula 8, E may be $C_nH_{2n+1}NH_3^+$, and n may be an integer from 1 to 9.

In the present specification, the compound having the perovskite structure in the third light absorbing layer includes a single cation. For example, in Chemical Formula 9, E may be $C_nH_{2n+1}NH_3^+$, and n may be an integer from 1 to 9.

In the present specification, M, M', and M" may be $Pb^{2+}$.

In an exemplary embodiment of the present specification, in the method for manufacturing an organic-inorganic hybrid solar cell, the first organic halide may be $C_nH_{2n+1}NH_3I$, the first metal halide may be $PbI_2$, and n may be an integer from 1 to 9.

In an exemplary embodiment of the present specification, in the method for manufacturing an organic-inorganic hybrid solar cell, the second organic halide may be $HC(NH_2)_2I$, $C_nH_{2n+1}NH_3Br$, or $(C_nH_{2n+1}NH_3)_y(HC(NH_2)_2)_{(1-y)}I_zBr_{(1-z)}$, n may be an integer from 1 to 9, 0<y<1, and 0<z<1.

In an exemplary embodiment of the present specification, in the method for manufacturing an organic-inorganic hybrid solar cell, the third organic halide may be $C_nH_{2n+1}NH_3I$, and n may be an integer from 1 to 9.

In the present specification, in the method for manufacturing an organic-inorganic hybrid solar cell, the first light absorbing layer may include $C_nH_{2n+1}NH_3PbI_3$, the second light absorbing layer may include $HC(NH_2)_2PbI_3$, and the third light absorbing layer may include $C_nH_{2n+1}NH_3PbI_3$, and n may be an integer from 1 to 9. Specifically, the organic-inorganic hybrid solar cell may be manufactured such that the first light absorbing layer includes $CH_3NH_3PbI_3$ (methylammonium lead iodide, $MAPbI_3$), the second light absorbing layer includes $HC(NH_2)_2PbI_3$ (formamidinium lead iodide, $FAPbI_3$), and the third light absorbing layer includes $CH_3NH_3PbI_3$.

In the present specification, in the organic-inorganic hybrid solar cell, the first light absorbing layer may include $C_nH_{2n+1}NH_3PbI_3$, the second light absorbing layer may include $(C_nH_{2n+1}NH_3)_y(HC(NH_2)_2)_{(1-y)}PbI_zBr_{(3-z)}$, the third light absorbing layer may include $C_nH_{2n+1}NH_3PbI_3$, n may be an integer from 1 to 9, 0<y<1, and 0<z<3. Specifically, the organic-inorganic hybrid solar cell may be manufactured such that the first light absorbing layer includes $CH_3NH_3PbI_3$, the second light absorbing layer includes $(C_nH_{2n+1}NH_3)_y(HC(NH_2)_2)_{(1-y)}PbI_zBr_{(3-z)}$, and the third light absorbing layer includes $CH_3NH_3PbI_3$.

In general, an organic-inorganic hybrid solar cell in which the light absorbing layer is manufactured to have the single layer has problems in that the stability of the absorbing layer deteriorates and the properties of the absorbing layer are changed due to lattice spacing according to a phase transition strongly depending on a temperature.

In the present specification, the organic-inorganic hybrid solar cell may be manufactured to further include a substrate. Specifically, the substrate may be provided at a lower portion of the first electrode.

In the present specification, as the substrate, it is possible to use a substrate having excellent transparency, surface smoothness, handling easiness, and waterproofing property. Specifically, a glass substrate, a thin film glass substrate, or a plastic substrate may be used. The plastic substrate may include a film such as polyethylene terephthalate (PET), polyethylene naphthalate (PEN), polyether ether ketone, and polyimide in the form of a single layer or a multi-layer. However, the substrate is not limited thereto, and a substrate typically used for an organic-inorganic hybrid solar cell may be used.

In the present specification, the first electrode may be an anode, and the second electrode may be a cathode. Further, the first electrode may be a cathode, and the second electrode may be an anode.

In the present specification, the first electrode may be a transparent electrode, and the organic-inorganic hybrid solar cell may absorb light by way of the first electrode.

When the first electrode is a transparent electrode, the first electrode may be a conductive oxide such as indium-tin oxide (ITO), indium-zinc oxide (IZO), and fluorine-doped tin oxide (FTO). Furthermore, the first electrode may be a semi-transparent electrode. When the first electrode is a semi-transparent electrode, the first electrode may be manufactured of a semi-transparent metal such as silver (Ag), gold (Au), magnesium (Mg), or an alloy thereof. When a semi-transparent metal is used as a first electrode, the organic-inorganic hybrid solar cell may have a micro cavity structure.

In the present specification, when the electrode is a transparent conductive oxide layer, as the electrode, it is possible to use an electrode in which a material having conductivity is doped on a flexible and transparent material such as plastic including polyethylene terephthalate (PET), polyethylene naphthalate (PEN), polypropylene (PP), polyimide (PI), polycarbonate (PC), polystyrene (PS), polyoxyethylene (POM), an AS resin (acrylonitrile styrene copolymer), an ABS resin (acrylonitrile butadiene styrene copolymer), triacetyl cellulose (TAC), polyarylate (PAR), and the like, in addition to glass and a quartz plate.

Specifically, the first electrode may be indium tin oxide (ITO), fluorine doped tin oxide (FTO), aluminum doped zinc oxide (AZO), indium zinc oxide (IZO), ZnO—$Ga_2O_3$, ZnO—$Al_2O_3$ and antimony tin oxide (ATO), and the like, and more specifically, ITO.

In the present specification, the second electrode may be a metal electrode. Specifically, the metal electrode may include one or two or more selected from the group consisting of silver (Ag), aluminum (Al), platinum (Pt), tungsten (W), copper (Cu), molybdenum (Mo), gold (Au), nickel (Ni), palladium (Pd), magnesium (Mg), chromium (Cr), calcium (Ca), samarium (Sm), and lithium (Li).

In the present specification, the organic-inorganic hybrid solar cell may have an n-i-p structure. When the organic-inorganic hybrid solar cell according to the present specification has an n-i-p structure, the second electrode may be a metal electrode. Specifically, when the organic-inorganic hybrid solar cell according to an exemplary embodiment of the present specification has an n-i-p structure, the second electrode may include gold (Au), silver (Ag), aluminum (Al), $MoO_3$/Au, $MoO_3$/Ag, $MoO_3$/Al, $V_2O_5$/Au, $V_2O_5$/Ag, $V_2O_5$/Al, $WO_3$/Au, $WO_3$/Ag, or $WO_3$/Al.

In the present specification, the n-i-p structure means a structure in which a first electrode, an electron transporting layer, a light absorbing layer, a hole transporting layer, and a second electrode are sequentially stacked.

In the present specification, the organic-inorganic hybrid solar cell may have a p-i-n structure. When the organic-inorganic hybrid solar cell according to the present specification has a p-i-n structure, the second electrode may be a metal electrode.

In the present specification, the p-i-n structure means a structure in which a first electrode, a hole transporting layer, a light absorbing layer, an electron transporting layer, and a second electrode are sequentially stacked.

In the present specification, the organic-inorganic hybrid solar cell may further include an additional layer provided between the first electrode and the second electrode. Specifically, according to an exemplary embodiment of the present specification, the additional layer may include one or more selected from the group consisting of a hole injection layer, a hole transporting layer, an electron blocking layer, an electron transporting layer, and an electron injection layer.

In the present specification, a material for the hole transporting layer and/or the electron transporting layer may be a material which increases the probability that charges produced move to an electrode by efficiently transferring electrons and holes to a light absorbing layer, but is not particularly limited.

In the present specification, the electron transporting layer may include a metal oxide. As the metal oxide, it is possible to specifically use one or two or more selected from Ti oxide, Zn oxide, In oxide, Sn oxide, W oxide, Nb oxide, Mo oxide, Mg oxide, Zr oxide, Sr oxide, Yr oxide, La oxide, V oxide, Al oxide, Y oxide, Sc oxide, Sm oxide, Ga oxide, Ta oxide, SrTi oxide, and a composite thereof, but the metal oxide is not limited thereto.

In the present specification, the electron transporting layer may improve characteristics of charges by using doping, and may modify a surface of the electron transporting layer by using a fluorene derivative, and the like.

In the present specification, the electron transporting layer may be formed by being applied onto one surface of a first electrode or coated in the form of a film by using a method such as sputtering, E-Beam, thermal deposition, spin coating, screen printing, inkjet printing, doctor blade, or gravure printing.

In the present specification, the hole transporting layer may be an anode buffer layer.

The hole transporting layer may be introduced into an upper portion of the light absorbing layer by a method such as spin coating, dip coating, inkjet printing, gravure printing, spray coating, doctor blade, bar coating, gravure coating, brush painting, and thermal deposition.

The hole transporting layer may use tertiary butyl pyridine (TBP), lithium bis(trifluoro methanesulfonyl)imide (LiTFSI), poly(3,4-ethylenedioxythiophene):poly(4-styrenesulfonate) [PEDOT:PSS], and the like, but the material is not limited thereto.

MODE FOR INVENTION

Hereinafter, the present specification will be described in detail with reference to Examples for specifically describing the present specification. However, the Examples according to the present specification may be modified in various forms, and it is not interpreted that the scope of the present specification is limited to the Examples described below in detail. The Examples of the present specification are provided to more completely explain the present specification to a person with ordinary skill in the art.

Example 1

An organic substrate (40 Ω/sq) coated with indium tin oxide (ITO) was washed sequentially with acetone and isopropyl alcohol (IPA) for 1 hour, respectively, by using an ultrasonic cleaner. An ITO substrate coated with $TiO_2$ (hereinafter, referred to as an electron transporting layer) was manufactured by repeating three times a procedure of spin-coating a solution including titanium dioxide ($TiO_2$) on the ITO substrate, and performing a heat treatment at 150° C. for 30 minutes.

A first light absorbing layer was formed by spin-coating a yellow solution, which was formed by dissolving 1 mM of lead iodide ($PbI_2$) (purity 99%, Sigma Aldrich Co., Ltd.) and 10 mg of $CH_3NH_3I$ (MAI) in 1 ml of dimethylformamide (DMF), on the electron transporting layer, and performing a heat treatment at 100° C. for 10 minutes.

Thereafter, a second light absorbing layer was formed by spin-coating 200 μl of a solution, which was formed by subdividing 72 mg of $(HC(NH_2)_2)I$ and dissolving (HC$(NH_2)_2$)I in 1 ml of isopropyl alcohol, on the upper portion of the first light absorbing layer, and performing a heat treatment at 100° C. for 30 minutes.

A hole transporting layer was formed by spin-coating, on the second light absorbing layer, a solution obtained by mixing an acetonitrile solution, in which 80 mg of spiro-OMeTAD (2,2',7,7'-tetrakis(N,N-di-p-methoxyphenylamine)-9,9'-spirobifluorene), 28.5 μl of tert-butylpyridine (tBP), and 17.5 μl of LiTFSI were mixed, with 1 ml of chlorobenzene. At this time, LiTFSI was dissolved in acetonitrile at a concentration of 520 mg/mL, and then added in a solution state thereto.

Silver (Ag) was deposited to a thickness of 150 nm on the hole transporting layer under a pressure of $10^{-8}$ torr to form a second electrode, thereby completing an organic-inorganic hybrid solar cell.

Example 2

An organic-inorganic hybrid solar cell was manufactured in the same manner as in Example 1, except that in order to form the second light absorbing layer, 300 μl of a solution formed by mixing $(HC(NH_2)_2)I$ and $CH_3NH_3Br$ at a molar ratio of 0.7:0.3 and then dissolving the mixture in 1 ml of isopropyl alcohol was spin-coated on the upper portion of the first light absorbing layer, and a heat treatment was performed at 100° C. for 30 minutes.

Example 3

An organic substrate (40 Ω/sq) on which indium tin oxide (ITO) was coated was washed sequentially with acetone and isopropyl alcohol (IPA) for 1 hour, respectively, by using an ultrasonic cleaner. An ITO substrate coated with $TiO_2$ (hereinafter, referred to as an electron transporting layer) was manufactured by repeating three times a procedure of spin-coating a solution including titanium dioxide ($TiO_2$) on the ITO substrate, and performing a heat treatment at 150° C. for 30 minutes.

A first light absorbing layer was formed by spin-coating a yellow solution, which was formed by dissolving 1 mM of lead iodide ($PbI_2$) (purity 99%, Sigma Aldrich Co., Ltd.) and 10 mg of $CH_3NH_3I$ (MAI) in 1 ml of dimethylformamide (DMF), on the electron transporting layer, and performing a heat treatment at 100° C. for 10 minutes.

Thereafter, a second light absorbing layer was formed by spin-coating 300 μl of a solution, which was formed by mixing $(HC(NH_2)_2)I$ and $CH_3NH_3Br$ at a molar ratio of 0.7:0.3 and then dissolving the mixture in 1 ml of isopropyl alcohol, on the upper portion of the first light absorbing layer, and performing a heat treatment at 100° C. for 30 minutes.

A third light absorbing layer was formed by spin-coating a solution, which was formed by dissolving 10 mg of $CH_3NH_3I$ (MAI) in 1 ml of isopropyl alcohol, on the second light absorbing layer, and performing a heat treatment at 100° C. for 30 minutes.

A hole transporting layer was formed by spin-coating, on the third light absorbing layer, a solution obtained by mixing an acetonitrile solution, in which 80 mg of spiro-OMeTAD (2,2',7,7'-tetrakis(N,N-di-p-methoxyphenylamine)-9,9'-spirobifluorene), 28.5 μl of tert-butylpyridine (tBP), and 17.5 μl of LiTFSI were mixed, with 1 ml of chlorobenzene. At this time, LiTFSI was dissolved in acetonitrile at a concentration of 520 mg/mL and then added in a solution state thereto.

Silver (Ag) was deposited to a thickness of 150 nm on the hole transporting layer under a pressure of $10^{-8}$ torr to form a second electrode, thereby completing an organic-inorganic hybrid solar cell.

Comparative Example 1

An organic substrate (40 Ω/sq) coated with indium tin oxide (ITO) was washed sequentially with acetone and isopropyl alcohol (IPA) for 1 hour, respectively, by using an ultrasonic cleaner. An ITO substrate coated with $TiO_2$ (hereinafter, referred to as an electron transporting layer) was manufactured by repeating three times a procedure of spin-coating a solution including titanium dioxide ($TiO_2$) on the ITO substrate, and performing a heat treatment at 150° C. for 30 minutes.

A yellow solution formed by dissolving 1 mM of lead iodide ($PbI_2$) (purity 99%, Sigma Aldrich Co., Ltd.) in 1 ml of dimethylformamide (DMF) was spin-coated on the electron transporting layer. Thereafter, a light absorbing layer was formed by spin-coating a solution formed by dissolving 72 mg of $HC(NH_2)_2(FAI)$ in 1 ml of isopropyl alcohol thereon, and performing a heat treatment at 100° C. for 10 minutes.

A hole transporting layer was formed by spin-coating, on the light absorbing layer, a solution obtained by mixing an acetonitrile solution, in which 80 mg of spiro-OMeTAD (2,2',7,7'-tetrakis(N,N-di-p-methoxyphenylamine)-9,9'-spirobifluorene), 28.5 μl of tert-butylpyridine (tBP), and 17.5 μl of LiTFSI were mixed, with 1 ml of chlorobenzene. At this time, LiTFSI was dissolved in acetonitrile at a concentration of 520 mg/mL and then added in a solution state thereto.

Silver (Ag) was deposited to a thickness of 150 nm on the hole transporting layer under a pressure of $10^{-8}$ torr to form a second electrode, thereby completing an organic-inorganic hybrid solar cell.

Table 1 shows the performance of each of the organic-inorganic hybrid solar cells according to exemplary embodiments of the present specification, and FIG. 5 illustrates a current density according to a voltage in each of the organic-inorganic hybrid solar cells manufactured in exemplary embodiments of the present specification.

TABLE 1

| | PCE (%) | $J_{sc}$ (mA/cm$^2$) | $V_{oc}$ (V) | FF (%) |
|---|---|---|---|---|
| Example 1 | 13.6 | 25.2 | 1.04 | 51.3 |
| Example 2 | 17.8 | 23.7 | 1.09 | 68.8 |
| Example 3 | 18.7 | 23.2 | 1.12 | 71.5 |
| Comparative Example 1 | 5.8 | 16.0 | 1.04 | 34.5 |

In Table 1, $V_{oc}$, $J_{sc}$, FF, and PCE mean an open-circuit voltage, a short-circuit current, a fill factor, and energy conversion efficiency, respectively. The open-circuit voltage and the short-circuit current are an X axis intercept and a Y axis intercept, respectively, in the fourth quadrant of the voltage-current density curve, and as the two values are increased, the efficiency of the solar cell is preferably increased. In addition, the fill factor is a value obtained by dividing the area of a rectangle, which may be drawn within the curve, by the product of the short-circuit current and the open-circuit voltage. The energy conversion efficiency may be obtained when these three values are divided by the intensity of the irradiated light, and the higher value is preferred.

FIG. 6 illustrates a state after storing the organic-inorganic hybrid solar cells manufactured in exemplary embodiments of the present specification under nitrogen atmosphere for 48 hours. It can be confirmed that the organic-inorganic hybrid solar cells according to Examples 1 to 3 had no change even after time elapsed, whereas the organic-inorganic hybrid solar cell according to Comparative Example 1 had a change in properties after 48 hours passed.

The invention claimed is:

1. A method for manufacturing an organic-inorganic hybrid solar cell, the method comprising:
   forming a first electrode;
   forming a first common layer on the first electrode;
   forming a first light absorbing layer by applying a first perovskite precursor solution including a first organic halide and a first metal halide on the first common layer;
   forming a second light absorbing layer by applying a second perovskite precursor solution including a second organic halide on the first light absorbing layer;
   forming a second common layer on the second light absorbing layer; and
   forming a second electrode on the second common layer;
   wherein the first organic halide is a compound of the following Chemical Formula 1, and
   wherein the second organic halide is a compound of the following Chemical Formula 5:

$$AX \quad \text{[Chemical Formula 1]}$$

wherein in Chemical Formula 1,
   A is a monovalent cation selected from $C_nH_{2+1}NH_3^+$, $HC(NH_2)_2^+$, $NH_4^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
   X is a halogen ion, and
   n is an integer from 1 to 9;

$$R'_yR''_{(1-y)}X'_zX''_{(1-z)} \quad \text{[Chemical Formula 5]}$$

wherein in Chemical Formula 5,
   R' and R" are different from each other, and each is a monovalent cation selected from the group consisting of: $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, X' and X" are each a halogen ion,
n is an integer from 1 to 9,
0<y<1, and
0<z<3.

2. The method for manufacturing an organic-inorganic hybrid solar cell of claim 1, further comprising:
   forming a third light absorbing layer by applying a third perovskite precursor solution including a third organic halide on the second light absorbing layer before forming the second common layer.

3. The method for manufacturing an organic-inorganic hybrid solar cell of claim 2, wherein the third organic halide is a compound of Chemical Formula 8:

$$EX''' \quad \text{[Chemical Formula 8]}$$

wherein in Chemical Formula 8,
   E is a monovalent cation selected from the group consisting of: $C_nH_{2n+1}NH_3^+$, $HC(NH_2)_2^+$, $NH_4^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
   X''' is a halogen ion, and
   n is an integer from 1 to 9.

4. The method for manufacturing an organic-inorganic hybrid solar cell of claim 2, wherein in the third perovskite precursor solution, a concentration of the third organic halide is 0.01 M to 0.15 M.

5. The method for manufacturing an organic-inorganic hybrid solar cell of claim 2, wherein the third light absorbing layer includes a compound having a perovskite structure of Chemical Formula 9:

$$EM''X'''_3 \quad \text{[Chemical Formula 9]}$$

wherein in Chemical Formula 9,
   E is a monovalent cation selected from the group consisting of: $C_nH_{2n+1}NH_3^+$, $NH_4^+$, $HC(NH_2)_2^+$, $CS^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
   M" is a divalent metal ion selected from the group consisting of: $Cu^{2+}$, $Ni^{2+}$, $CO^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$,
   X''' is a halogen ion, and
   n is an integer from 1 to 9.

6. The method for manufacturing an organic-inorganic hybrid solar cell of claim 2, wherein the third light absorbing layer is formed to have a thickness of 1 nm to 100 nm.

7. The method for manufacturing an organic-inorganic hybrid solar cell of claim 2, wherein the third organic halide is $C_nH_{2n+1}NH_3I$, and
   n is an integer from 1 to 9.

8. The method for manufacturing an organic-inorganic hybrid solar cell of claim 1, wherein the first metal halide is a compound of Chemical Formula 2:

$$MX_2 \quad \text{[Chemical Formula 2]}$$

wherein in Chemical Formula 2,
   M is a divalent metal ion selected from the group consisting of: $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, and
   X is a halogen ion.

9. The method for manufacturing an organic-inorganic hybrid solar cell of claim 1, wherein in the first perovskite precursor solution, a concentration of the first organic halide is 0.01 M to 0.15 M.

10. The method for manufacturing an organic-inorganic hybrid solar cell of claim 1, wherein in the first perovskite precursor solution, a concentration of the first metal halide is 0.5 M to 1.5 M.

11. The method for manufacturing an organic-inorganic hybrid solar cell of claim 1, wherein the first light absorbing layer includes a compound having a perovskite structure of Chemical Formula 3:

$$AMX_3 \qquad \text{[Chemical Formula 3]}$$

wherein in Chemical Formula 3,

A is a monovalent cation selected from the group consisting of: $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M is a divalent metal ion selected from the group consisting of: $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X is a halogen ion, and n is an integer from 1 to 9.

12. The method for manufacturing an organic-inorganic hybrid solar cell of claim 1, wherein the second light absorbing layer includes a compound having a perovskite structure of Chemical Formula 6 or 7:

$$R'_y R''_{(1-y)} M' X'_z X''_{(3-z)} \qquad \text{[Chemical Formula 7]}$$

wherein in Chemical Formula 6 or 7,

R' and R'' are different from each other, and R', and R'' are each a monovalent cation selected from the group consisting of: $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3ASH_3^+$, $CH_3SbH_3^+$, $PH_4^+$, $ASH_4^+$, and $SbH_4^+$, M' is a divalent metal ion selected from the group consisting of: $Cu^{2+}$, $Ni^{2+}$, $CO^{2+}$, $Fe^{2+}$, $Mn^{2+}$, $Pd^{2+}$, $Ge^{2+}$, $Sn^{2+}$, $Pb^{2+}$, and $Yb^{2+}$, X' and X'' are each a halogen ion, n is an integer from 1 to 9, $0<y<1$, and $0<z<3$.

13. The method for manufacturing an organic-inorganic hybrid solar cell of claim 1, wherein the first light absorbing layer is formed to have a thickness of 1 nm to 100 nm.

14. The method for manufacturing an organic-inorganic hybrid solar cell of claim 1, wherein the second light absorbing layer is formed to have a thickness of 1 nm to 600 nm.

15. The method for manufacturing an organic-inorganic hybrid solar cell of claim 1, wherein the first organic halide is $C_nH_{2n+1}NH_3I$, the first metal halide is $PbI_2$, and n is an integer from 1 to 9.

16. The method for manufacturing an organic-inorganic hybrid solar cell of claim 1, wherein the second organic halide is $(C_nH_{2n+1}NH_3)_y (HC(NH_2)_2)_{(1-y)}I_zBr_{(1-z)}$, wherein n is an integer from 1 to 9, $0<y<1$, and $0<z<1$.

* * * * *

UNITED STATES PATENT AND TRADEMARK OFFICE
CERTIFICATE OF CORRECTION

Page 1 of 2

PATENT NO. : 11,004,617 B2
APPLICATION NO. : 16/319238
DATED : May 11, 2021
INVENTOR(S) : Seiyong Kim et al.

It is certified that error appears in the above-identified patent and that said Letters Patent is hereby corrected as shown below:

In the Claims

At Column 13, Lines 34-67 and at Column 14, Lines 1-4, please replace Claim 1 with the following:
1. A method for manufacturing an organic-inorganic hybrid solar cell, the method comprising:
    forming a first electrode;
    forming a first common layer on the first electrode;
    forming a first light absorbing layer by applying a first perovskite precursor solution including a first organic halide and a first metal halide on the first common layer;
    forming a second light absorbing layer by applying a second perovskite precursor solution including a second organic halide on the first light absorbing layer;
    forming a second common layer on the second light absorbing layer; and
    forming a second electrode on the second common layer,
    wherein the first organic halide is a compound of the following Chemical Formula 1, and
    wherein the second organic halide is a compound of the following Chemical Formula 5:
    [Chemical Formula 1]
        AX
wherein in Chemical Formula 1,
    A is a monovalent cation selected from $C_nH_{2n+1}NH_3^+$, $HC(NH_2)_2^+$, $NH_4^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
    X is a halogen ion, and
    n is an integer from 1 to 9;
    [Chemical Formula 5]
        $R'_yR''_{(1-y)}X'_zX''_{(1-z)}$
wherein in Chemical Formula 5,
    R' and R'' are different from each other, and each is a monovalent cation selected from the group consisting of: $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$,
    X' and X'' are each a halogen ion,
    n is an integer from 1 to 9, Signed and Sealed this
Third Day of August, 2021

Drew Hirshfeld
*Performing the Functions and Duties of the
Under Secretary of Commerce for Intellectual Property and
Director of the United States Patent and Trademark Office*

$0 < y < 1$, and
$0 < z < 3$.

At Column 14, Lines 28-44, please replace Claim 5 with the following:

5. The method for manufacturing an organic-inorganic hybrid solar cell of claim 2, wherein the third light absorbing layer includes a compound having a perovskite structure of Chemical Formula 9:

[Chemical Formula 9]

$EM''X'''_3$ wherein in Chemical Formula 9,

E is a monovalent cation selected from the group consisting of: $C_nH_{2n+1}NH_3^+$, $NH_4^+$, $HC(NH_2)_2^+$, $CS^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M" is a divalent metal ion selected from the group consisting of: $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X''' is a halogen ion, and n is an integer from 1 to 9.

At Column 15, Lines 17-27 and at Column 16, Lines 1-7, please replace Claim 12 with the following:

12. The method for manufacturing an organic-inorganic hybrid solar cell of claim 1, wherein the second light absorbing layer includes a compound having a perovskite structure of Chemical Formula 7:

[Chemical Formula 7]

$R'_y R''_{(1-y)} M' X'_z X''_{(3-z)}$ wherein in Chemical Formula 7,

R' and R" are different from each other, and R', and R" are each a monovalent cation selected from the group consisting of: $C_nH_{2n+1}NH_3^+$, $NH_4^+$, $HC(NH_2)_2^+$, $Cs^+$, $NF_4^+$, $NCl_4^+$, $PF_4^+$, $PCl_4^+$, $CH_3PH_3^+$, $CH_3AsH_3^+$, $CH_3SbH_3^+$, $PH_4^+$, $AsH_4^+$, and $SbH_4^+$, M' is a divalent metal ion selected from the group consisting of: $Cu^{2+}$, $Ni^{2+}$, $Co^{2+}$, $Fe^{2+}$, $Mn^{2+}$, $Cr^{2+}$, $Pd^{2+}$, $Cd^{2+}$, $Ge^{2+}$, $Sn^{2+}$, $Pb^{2+}$, and $Yb^{2+}$, X' and X" are each a halogen ion, n is an integer from 1 to 9, $0 < y < 1$, and $0 < z < 3$.